United States Patent [19]

Stevens et al.

[11] Patent Number: 5,639,325

[45] Date of Patent: Jun. 17, 1997

[54] PROCESS FOR PRODUCING A GLASS-COATED ARTICLE

[75] Inventors: Ralph E. Stevens, Merrimack, N.H.; Richard J. Perko, Chelmsford, Mass.; R. James Gibson, Chandler, Ariz.

[73] Assignee: The Whitaker Corporation, Wilmington, Del.

[21] Appl. No.: 381,735

[22] Filed: Feb. 1, 1995

[51] Int. Cl.[6] .................... B32B 31/26; B05D 5/12
[52] U.S. Cl. .................... 427/96; 65/43; 264/61; 427/58; 427/126.2; 257/634
[58] Field of Search .................. 156/89; 65/36, 65/43, 59.1, 59.5, 60.1, 60.8; 427/96, 126.2, 376.2; 428/428; 257/634, 644; 437/190, 62

[56] References Cited

U.S. PATENT DOCUMENTS

| | | |
|---|---|---|
| 3,212,921 | 10/1965 | Pliskin et al. . |
| 3,247,428 | 4/1966 | Perri et al. . |
| 3,303,399 | 2/1967 | Hoogendoorn et al. . |
| 3,323,956 | 6/1967 | Gee . |
| 3,496,631 | 2/1970 | Chen ........................... 257/634 X |
| 3,514,848 | 6/1970 | Rueffer et al. ................. 65/36 X |
| 3,632,433 | 1/1972 | Hoya-shi et al. ............... 257/634 X |
| 3,632,434 | 1/1972 | Hutson . |
| 3,760,242 | 9/1973 | Duffy et al. . |
| 4,093,771 | 6/1978 | Goldstein et al. .................. 428/312 |
| 4,133,690 | 1/1979 | Muller ............................... 106/52 |
| 4,344,985 | 8/1982 | Goodman et al. .............. 257/644 X |
| 4,369,220 | 1/1983 | Prabhu et al. .................... 428/209 |
| 4,737,236 | 4/1988 | Perko et al. ...................... 156/644 |
| 4,764,486 | 8/1988 | Ishihara et al. ..................... 501/9 |
| 4,781,775 | 11/1988 | Reed et al. ...................... 156/89 |
| 4,788,163 | 11/1988 | Hang et al. ..................... 501/17 |
| 4,978,379 | 12/1990 | Sawada et al. ................. 156/89 X |
| 5,212,121 | 5/1993 | Omata et al. ..................... 501/32 |

FOREIGN PATENT DOCUMENTS

| | | |
|---|---|---|
| 1910746 | 12/1970 | Germany . |
| 3516222 | 6/1986 | Germany ................... H01L 23/30 |
| 58-186948 | 1/1983 | Japan ........................ H01L 21/84 |
| 62-122152 | 3/1987 | Japan ........................ H01L 23/12 |
| 5002117 | 8/1993 | Japan . |

OTHER PUBLICATIONS

PCT International Search Search Report. International Application No. PCT/US96/00226. International Filing Date Mar. 1, 1996.

*Primary Examiner*—David A. Simmons
*Assistant Examiner*—M. Curtis Mayes

[57] ABSTRACT

A process for producing a glass-coated article having a silicon substrate and the article produced thereby are provided. According to the process of the present invention, a layer of glass wetting agent material is formed on the substrate to improve wetting of a glass material to the article. A desired thickness of the glass material is applied to the layer of wetting agent material. The article is then fired and subjected to ambient conditions sufficient to melt the glass material and to form a substantially uniform layer of glass material that is substantially devoid of void pockets and deformities. Particular utility for the present invention is found in the areas of fabrication of electronic circuit boards and semiconductor devices, although other utilities are contemplated.

4 Claims, 4 Drawing Sheets

PROCESS FOR PRODUCING A GLASS-COATED ARTICLE

This invention was made with Government support under Agreement No. F33615-94-2-1524 awarded by the United States Air Force, Wright Laboratory. The Government has certain rights in the invention.

BACKGROUND OF THE INVENTION

1. Field of the Invention

The present invention relates generally to a process for forming a glass coating on a silicon substrate and products made thereby, and more specifically, to a process for forming a relatively thick layer (e.g., 25–250 microns) of electronics grade glass on a silicon substrate and to products formed thereby. Particular utility for the present invention is found in the area of fabrication of electronic components, such as printed circuit boards, although other utilities are contemplated, such as fabrication of semiconductor and microwave devices and multichip modules.

2. Brief Description of Related Prior Art

Printed circuit boards (PCBs) are used extensively in the electronics arts to mount and interconnect discrete electronic components (integrated circuit chips, etc.) to implement a specific function. Commonly, the board substrate is made of silicon, although other materials, such as polymers and ceramics are also used. Often, it is desirable to electrically isolate (insulate) certain components mounted on the PCB from each other and from the board substrate. Typically, this is accomplished by applying one or more layers of dielectric material to the surface of the board and then mounting the components on or in the dielectric layers.

Many processes exist in the prior art to form such dielectric layers on a silicon substrate. Common techniques for forming dielectric layers include chemical vapor deposition (CVD) and spin-on-glass (SOG) techniques. These processes are essentially limited to producing dielectric layers of only several microns in thickness, due to their inability to effectively prevent cracking of layers of greater thicknesses and/or their prohibitively slow formation rates. This is unfortunate, since in many applications it is critical that capacitive coupling between the substrate and the components be made as low as possible, and dielectric layers of only several microns in thickness are inadequate to provide this degree of capacitive isolation. Additionally, many of these processes are incapable of forming a dielectric layer having a sufficiently high dielectric constant (e.g., at least 4.1 at 20 degrees C. and 1 MHz) and sufficiently low loss tangent (e.g., at most 0.06 percent at 20 degrees C. and 1 MHz) to permit use of the resulting board in high performance electronics applications (e.g., microwave and/or other radio frequency circuit applications).

Prior art processes also exist for producing a relatively thick layer of dielectric such as glass on a silicon substrate. However, in general, in these processes, the thermal expansion characteristics (i.e., thermal coefficient of expansion) of the glass are not adequately matched to those of the substrate. Since circuit boards must be able to operate over a wide temperature range, any mismatch between the thermal expansion characteristics of the substrate and the glass can cause mechanical stresses that can result in deformation of the substrate and mounted components, cracking of the glass, etc.

U.S. Pat. No. 4,133,690 to Muller discloses one example of a process for coating a silicon substrate with a dielectric glass composition. The glass composition is applied to the substrate in the form of a finely ground powder and thereafter fused onto at least a portion of the substrate. The glass may comprise borosilicate. In one example, the glass powder is applied to the substrate in the form of an aqueous suspension of about 250 microns in thickness. The suspension is then dried to remove the carrier fluid and fired to melt the glass. The resultant glass layer is about 200 microns thick.

Disadvantageously, during the Muller process (and similar prior art processes, including prior art "tape glass" techniques), the edges of the glass film can pull away from the substrate, due to the inherently high surface tension characteristics of melting glass. That is, during melting of the glass particles, their inherently powerful tendency to flow together can become greater than their relatively weaker tendency to bond or adhere to the surface of the substrate. This can cause the resulting glass layer to be non-uniform (i.e., the glass layer may be discontinuous, and may contain unintended void pockets, and/or other deformities). This condition can seriously degrade the electrical properties of the glass layer, and the resulting PCB.

Other problems also plague prior art processes. Some processes apply a layer of metal and/or other conductive material to the substrate prior to deposition of the glass material and firing of the PCB. Disadvantageously, it has been found that during firing of the PCB, the conductive layer often reacts with the underlying silicon to form a composite material. This can also result in serious degradation of the electrical properties of the conductive layer and the resulting PCB.

Similar prior art processes are disclosed in Goldstein et al, U.S. Pat. No. 4,093,771 and Prabhu et al., U.S. Pat. No. 4,369,220. These processes suffer from the aforesaid and/or other disadvantages.

OBJECT OF THE INVENTION

It is the object of the present invention to provide an article having a silicon substrate and a relatively thick and uniform glass layer, and a process for producing same, that do not suffer from the aforesaid (and other) disadvantages of the prior art.

SUMMARY OF THE INVENTION

According to the present invention, a process for producing an article having a thick glass layer on a silicon substrate and the article produced thereby are provided. In broad concept, in the process of the present invention, a layer of adhesion material is formed on a silicon substrate for improving wetting of a glass material to the substrate during firing thereof. A desired thickness of the glass material is applied to the layer of adhesion material. The article is fired at elevated temperature under pressure and atmosphere conditions for melting the glass material and forming a substantially uniform layer of glass material.

Advantageously, the present invention permits formation of a relatively thick glass layer on the silicon substrate that is substantially uniform, does not suffer from the "edge pull back" phenomena during firing, and that offers desired electrical properties and thermal expansion characteristics. None of the prior art is capable of providing this combination of advantages.

These and other advantages of the present invention will become apparent as following Detailed Description proceeds and upon reference to the Drawings, wherein like numerals depict like parts, and wherein:

Although the present invention will be described in connection with preferred embodiments and methods of use, it will be appreciated by those skilled in the art that it is not intended to be limited to these preferred embodiments and methods of use. On the contrary, the present invention is intended to be viewed as being of broad scope, as only defined by the hereinafter appended claims.

DETAILED DESCRIPTION OF PREFERRED EMBODIMENTS

Figure 1:
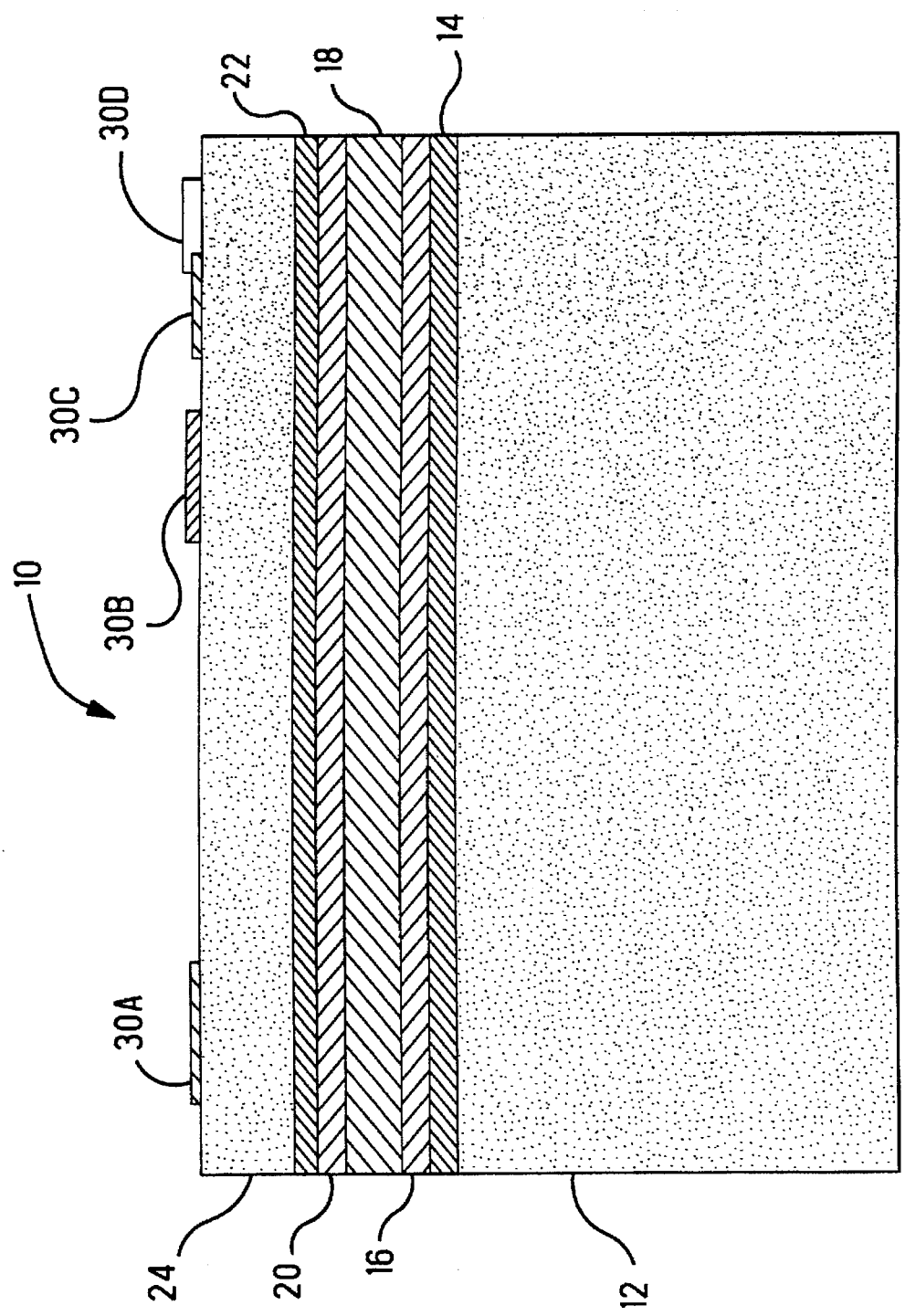
FIG. 1 is a side cross-sectional view of one preferred embodiment of a glass-coated article having a silicon substrate made according to the present invention, which embodiment may be used as a printed circuit board.

FIG. 1 is side cross-sectional view of one preferred embodiment of a glass-coated article 10 made according to the present invention, which preferred embodiment may be used as a printed circuit board. Circuit board 10 comprises a silicon substrate or wafer 12, which preferably is of the type suitable for use in fabricating integrated circuits and solar cells. The substrate 12 may be of any doping, crystal, and crystal orientation type.

Disposed upon substrate 12 is a first adhesion layer 14 for enhancing the bonding or wetting of subsequent layers to the silicon substrate 12. Preferably, adhesion layer 14 is made of titanium and has a thickness of about 300–2000 Angstroms (and most preferably about 500 Angstroms), but other materials and thicknesses may be used, so long as they provide enhancement of the ability of subsequent layers to bond to the silicon substrate, and other constraints (which will be discussed in greater detail below) are satisfied. For example, boron oxide, silicon dioxide or tungsten may also be used without departing from this embodiment of the present invention. If titanium is used, it may also be partially reacted with other materials, such as silicon, oxygen, etc. If tungsten is used, it preferably is deposited as a tungsten rich mixture of tungsten and titanium, preferably in one of the following ratios, by weight, of tungsten to titanium: 95% to 5%; 90% to 10%; or 75% to 25%.

Interlayer diffusion barrier layer 16 is disposed upon adhesion layer 14 and serves as a diffusion barrier between conductive layer 18, and adhesion layer 14 and substrate 12. That is, the chemical composition and properties of barrier layer 16 are adapted substantially to prevent diffusion of conductive layer 18 to the layers beneath it (i.e., adhesion layer 14 and substrate 12) during formation (i.e., firing) of the article 10. Preferably, diffusion barrier layer 16 comprises a platinum film having a thickness of about 1000 Angstroms, although other materials and thicknesses may be used, so long as they act adequately to prevent diffusion of conductive layer 18 to the layers beneath it, and other design constraints are satisfied.

Conductive layer 18 serves as the ground plane of the board 10 and preferably is made of gold, silver, or some other highly conductive metal and has a thickness of several microns. The type of conductive material chosen is variable, but must be compatible with the process of the subject invention, which will be discussed in detail shortly.

Another diffusion barrier layer 20 is disposed on top of conductive layer 18 and serves as a diffusion barrier between conductive layer 18 and the glass adhesion layer 22. Preferably, the composition and thickness of layer 20 are substantially similar to those of barrier layer 16; however, if required by particular design considerations, layer 20 may be different from layer 16, so long as it substantially prevents diffusion between adhesion layer 22 and conductive layer 18.

Adhesion layer 22 is disposed upon diffusion barrier layer 20 and serves to enhance the bonding or wetting of glass layer 24 to diffusion barrier layer 20. Preferably, adhesion layer 22 is of the same composition and thickness as adhesion layer 14. Advantageously, it has been found that when adhesion layer 22 is used to enhance the bonding of glass layer 24 to diffusion barrier layer 20 in accordance with the process of the present invention, the uniformity of the glass layer 24 is substantially improved over the prior art and the problems associated with "roll back" of the edges of the glass layer during firing of the article substantially may be eliminated.

Disposed upon glass adhesion layer 22 is glass layer 24 which serves to electrically isolate and capacitively de-couple conventional discrete electronic components 30A ... 30D (mounted on or in glass layer 24) from each other, ground plane 18, and substrate 12. Preferably, glass layer 24 is between 25 and 250 microns in thickness and is of a borosilicate glass composition. Most preferably, glass layer 24 is made of a glass such as Corning 7070 borosilicate glass which has a thermal coefficient of expansion that is substantially equal to silicon over the typical operating temperature range of the circuit board (i.e., about –65° C. to 400° C.), a maximum loss tangent of about 0.06 percent and a minimum dielectric constant of about 4.1 at 20 degrees C. and 1 MHz. Thus, advantageously, by using this composition to form glass layer 24, the glass layer 24 will exhibit thermal expansion characteristics that are substantially identical to those of the underlying silicon 12, and that adequately electrically and capacitively de-couples the components 30A ... 30D from themselves, the ground plane 18, and the substrate 12. Of course, depending upon the desired characteristics of the resulting PCB, other types of glass compositions may be employed for layer 24, but preferably they exhibit electrical and thermal characteristics that are substantially the same as those of Corning 7070 glass.

Figure 2:
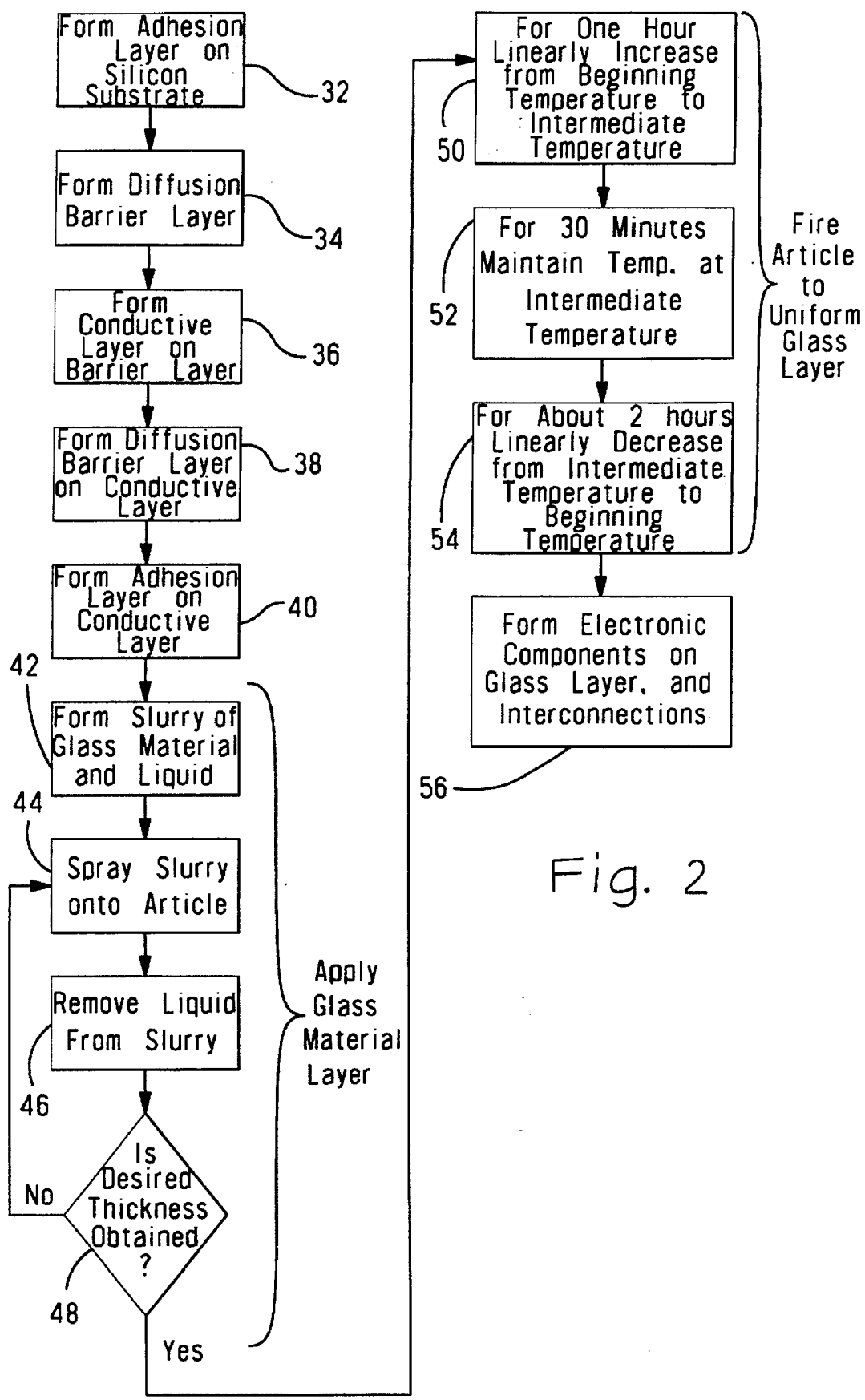
FIG. 2 is a block diagram showing the major steps of a preferred fabrication process in accordance with the present invention for producing the circuit board of FIG. 1.

With particular reference now being made to FIGS. 2, a preferred fabrication sequence for producing the article 10 of FIG. 1 is comprised of steps represented by blocks 32 through 56. It should be understood from the outset that unless otherwise specified, any conventional method may be employed to perform any of the formation and/or deposition steps discussed herein.

The process begins by forming the first adhesion layer on the silicon substrate at block 32. After formation of the first adhesion layer, the first diffusion barrier layer is formed on the first adhesion layer at block 34. The conductive ground plane layer is then formed on the first diffusion barrier layer at block 36. Thereafter, the second diffusion barrier layer is formed on top of the conductive layer at block 38. The second adhesion layer is then formed on the second barrier layer at block 40.

At this point the glass material is then applied to top of the second adhesion layer. Preferably, application of the glass material is accomplished by forming a slurry or paste of powdered ("frit") glass material in liquid at block 42. Preferably, the liquid is a room-temperature volatile organic solvent (e.g., alcohol) and/or water. Preferably, the slurry is composed of equal volumes of liquid and glass and is of low enough viscosity to permit spraying of the slurry onto the adhesion layer. In a preferred embodiment of the invention, the glass frit material has an average granular size of about 325 Mesh.

After formation, the slurry is then sprayed onto the top of the second adhesion layer at block 44. Preferably, this is accomplished by spraying the slurry onto the second adhesion layer, permitting the slurry to dry, and repeating the spraying and drying steps, in sequence, until sufficient glass material has been deposited onto the article at block 46 to produce the desired thickness of glass layer 24 after firing. Optionally, the liquid may be removed from the slurry in between the repeated sprayings by appropriately elevating and then maintaining the temperature to evaporate or otherwise decompose the liquid to remove it from the slurry at block 46.

Of course, other methods for applying the glass layer to the article also may be used without departing from the subject invention. Other techniques which may be used include application of glass material using a "doctor" blade, or by screen printing, transfer stamping, and/or adhering a free-standing film created with a polymer-frit mix. Additionally, conventional "tape" application processes may be used.

Once sufficient glass material is deposited onto the second adhesion layer, the article is fired under ambient pressure conditions to melt the glass material and to form a substantially uniform layer of glass material on the article. Preferably, firing is conducted in stages including a first stage which comprises, over a time period of about one to two hours, preferably about one hour, linearly increasing (i.e., ramping up) the temperature of the article from the initial or beginning ambient temperature (i.e., about 20 degrees C. or higher, if temperature has already been increased to evaporate the liquid) to an intermediate temperature of about 900 to 1025 degrees C., preferably 1025 degrees C. at block 50. During this time period, any remaining liquid in the slurry is driven off. Thereafter, in the second stage, the intermediate temperature is maintained for a period of time, e.g. about 15 to 45 minutes, most preferably about 30 minutes, to melt and flow the glass particles at block 52. Thereafter, in a third stage, which preferably lasts for about two to about four hours, most preferably about two hours, the temperature is linearly decreased (i.e., ramped down) from the intermediate temperature to the beginning or ambient temperature at block 54. By following this three stage process, substantially all air pockets, void spaces, deformities, etc. are driven out of the flowing glass, and the glass becomes annealed and bonded to the underlying article. Advantageously, the second adhesion material layer increases the ability of the glass to bond to the underlying article such that the problems of edge "roll-back" and other non-uniformities are substantially eliminated from the resulting glass layer. Thus, the process of the present invention produces a glass-coated article wherein the glass layer is substantially uniform and free of edge "roll-back" and other deformities. Also advantageously, the use of the barrier layers prevent the various layers separated by them from being diffused into each other during firing of the article.

Finally, electronic circuit elements, components and/or interconnections may be formed on the glass layer using conventional and/or other types of fabrication techniques at block 56.

Figure 3:
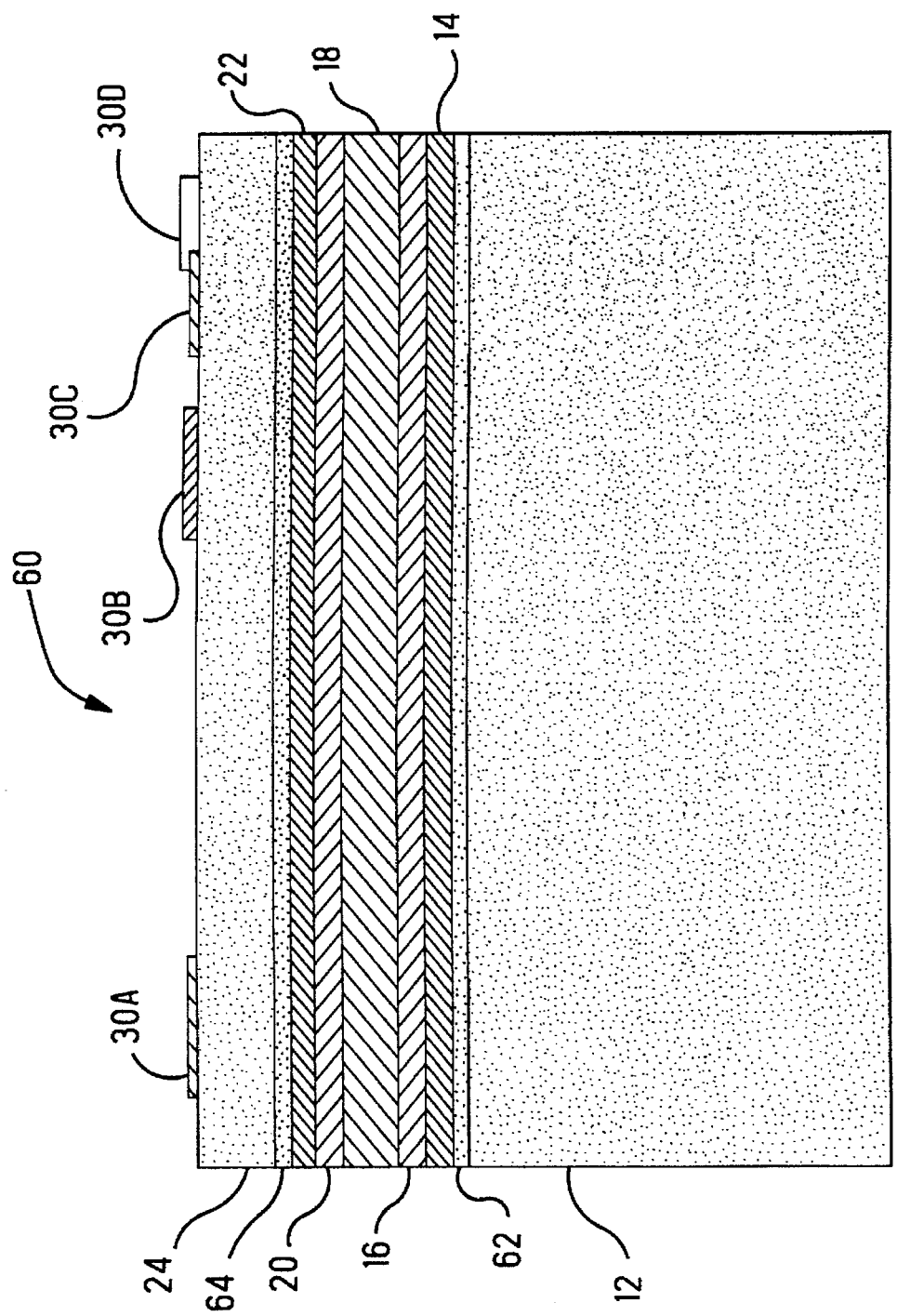
FIG. 3 is a side cross-sectional view of another preferred embodiment of an article made according to the present invention, which embodiment may also be used as a circuit board.

FIG. 3 is a side, cross-sectional view of another preferred embodiment 60 of the article of the present invention. Article 60 may be used as a printed circuit board and, with the exception of the inclusion of additional diffusion barrier layer 62 and additional adhesion layer 64, is substantially identical to embodiment 10 of FIG. 1. Preferably, diffusion barrier layer 62 is made of silicon dioxide formed by thermal oxidation of substrate 12, and helps to prevent adhesion layer 14 and diffusion barrier layer 16 from being diffused into substrate 12 during firing.

Figure 4:
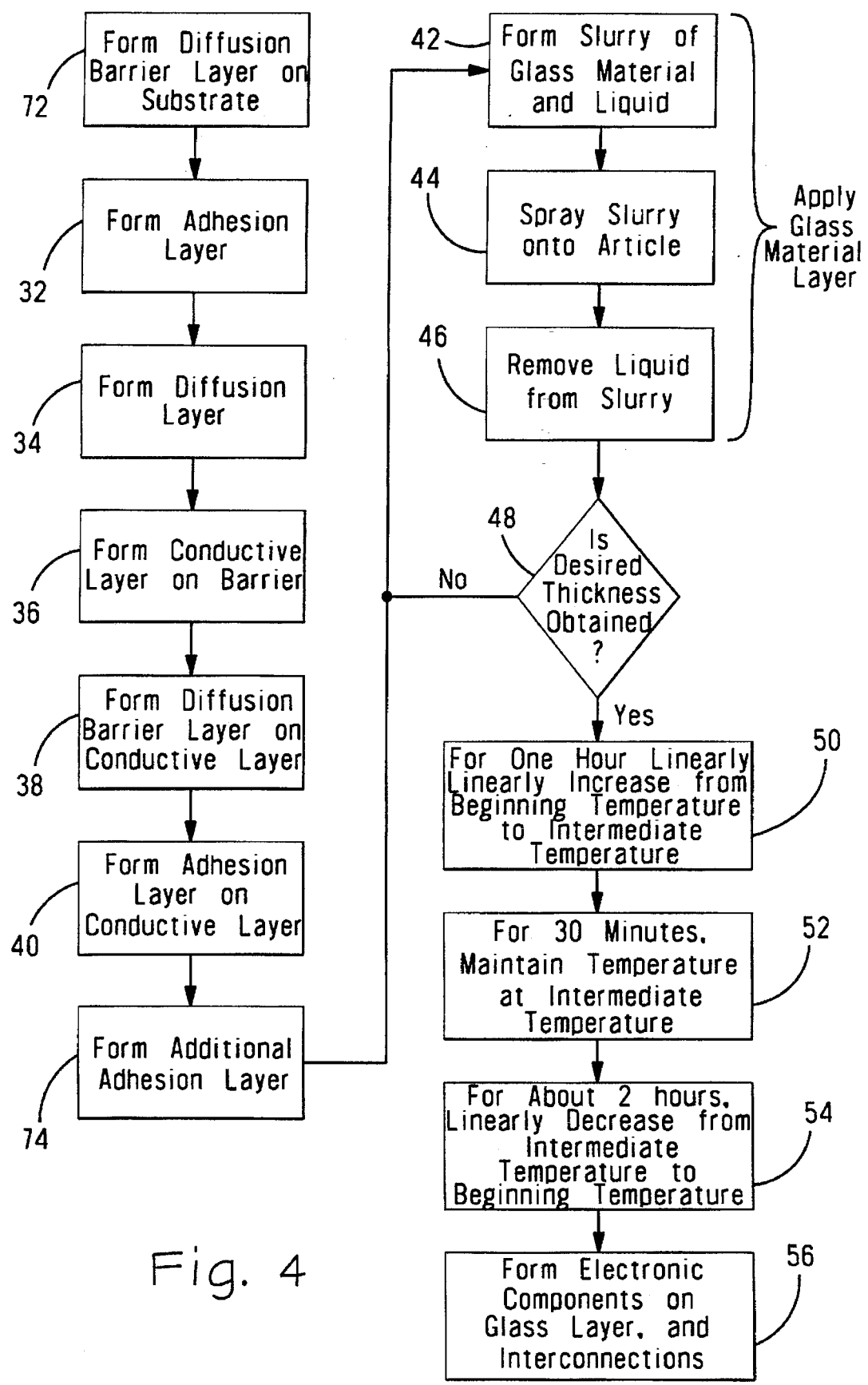
FIG. 4 is a block diagram showing the major steps of another preferred fabrication process in accordance with the present invention for producing the article of FIG. 3.

Additional adhesion layer 64 is also preferably made of silicon dioxide, and increases the glass wetting characteristics of adhesion layer 22. The process used to form article 60 is identical to that used to construct article 10, except that steps 70, 72 for forming layers 62 and 64, respectively, are included in the process for forming article 10. The preferred process for forming article 60 is illustrated in block diagram form in FIG. 4.

Thus, it is evident that there has been provided a process and article that fully satisfy both the aims and objects hereinbefore set forth. Various modifications may be made to the preferred embodiments and methods of use hereinbefore set forth without departing from the scope of the invention. For example, the materials of the adhesion, conducting, and barrier layers may be varied, so long as the aforesaid design constraints are satisfied, and the materials are compatible with the temperatures being used in the firing process. In other words, the materials used in the adhesion, conducting and barrier layers should have melting temperatures above the temperatures used in the firing of the article to melt the glass material. Also, silicon substrate topography and/or type may be varied, for example, using a highly doped or float zone silicon. Also, the environment in which the articles 10, 60 are fired may be varied. For example, rather than firing under air, firing may be conducted, for example, under an inert hydrogen atmosphere. For firing under hydrogen, an intermediate temperature of about 800° C. has been found to be preferred. Of course, other temperatures, pressures, and environments may be used, assuming compliance exists with the above-presented principles of the present invention. Additionally, and depending upon the type of binder used in the slurry, the process of the present invention may include the additional step of initially ramping up the temperature of the article to a lower intermediate temperature of about 150°–500° C., and holding it there for about 15–30 minutes to completely burn off the binder liquid in the slurry, before proceeding to the intermediate temperature. Additionally, the adhesion or wetting layer may be patterned prior to adding the glass such as to leave voids whereby to produce a product having a glass layer with built-in vias with access to ground. Other modifications are also possible. Therefore, it is intended that the subject invention be viewed broadly to encompass all such modifications, and that it defined only by the hereinafter appended claims.

We claim:

1. A process for producing a fired glass-coated article having a silicon substrate, comprising the steps of:
    forming a first adhesion layer on said silicon substrate; forming a first diffusion barrier layer on said first adhesion layer; forming a conductive layer on said first barrier layer; forming a second diffusion barrier layer on said conductive layer; forming a second adhesion layer on said second diffusion barrier layer; and forming a glass layer on said second adhesion layer.

2. A process as recited in claim 1 wherein said first and second adhesion layers are titanium.

3. A process as recited in claim 1 wherein said first and said second diffusion barrier layers are platinum.

4. A process as recited in claim 1 wherein said glass layer is formed by the steps in the sequence of:
   i. forming a slurry of glass material and a liquid;
   ii. disposing said slurry upon said second adhesion layer;
   iii. increasing temperature of the article of step ii to a temperature sufficient to remove said liquid from said slurry.

* * * * *